(12) United States Patent
Chen

(10) Patent No.: US 7,753,704 B2
(45) Date of Patent: Jul. 13, 2010

(54) ELECTRICAL CONTACT WITH C-SHAPED SPRING PORTION INTERCONNECTING UPPER CONTACTING ARM PORTION AND LOWER SOLDERING LEG

(75) Inventor: Ming-Yue Chen, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/154,305

(22) Filed: May 22, 2008

(65) Prior Publication Data

US 2008/0293279 A1    Nov. 27, 2008

(30) Foreign Application Priority Data

May 22, 2007    (CN)    ............ 2007 2 0037867

(51) Int. Cl.
*H01R 11/22*    (2006.01)
(52) U.S. Cl. .................................... 439/268
(58) Field of Classification Search .......... 439/66, 439/83, 68, 78, 342, 856, 857, 884, 876, 439/263
See application file for complete search history.

(56) References Cited

U.S. PATENT DOCUMENTS

| | | | | |
|---|---|---|---|---|
| 6,155,845 | A * | 12/2000 | Lin et al. | 439/83 |
| 6,533,591 | B1 * | 3/2003 | Lee | 439/83 |
| 6,692,265 | B2 * | 2/2004 | Kung et al. | 439/68 |
| 6,702,594 | B2 * | 3/2004 | Lee et al. | 439/83 |
| 6,824,414 | B2 * | 11/2004 | Whyne et al. | 439/342 |
| 6,830,471 | B2 * | 12/2004 | Okita et al. | 439/342 |
| 7,140,886 | B1 * | 11/2006 | Chen | 439/83 |

* cited by examiner

*Primary Examiner*—Chandrika Prasad
(74) *Attorney, Agent, or Firm*—Andrew C. Cheng; Wei Te Chung; Ming Chieh Chang

(57) ABSTRACT

An electrical contact (5) adapted for connection a BGA device to a PCB includes a pair of arm portions defining a pair of clamping portions (51, 52) at top ends thereof for corresponding solder balls of the BGA device, a C-shaped spring portion (53) extending from a bottom end of one arm portion (51) and a contacting portion (54) extending from a free end of the spring portion for touch the PCB. The spring portion opens perpendicularly to the arm portions.

10 Claims, 6 Drawing Sheets

ELECTRICAL CONTACT WITH C-SHAPED SPRING PORTION INTERCONNECTING UPPER CONTACTING ARM PORTION AND LOWER SOLDERING LEG

BACKGROUND OF THE INVENTION

1. Field of the invention

The present invention relates to an electrical connector adapted for a ball grid array (BGA) device, especially to a test socket for a BGA device.

2. Description of Related Art

As FIG. 1 shown, a conventional contact 100 adapted for a test socket includes a base portion 102 and a solder leg 101 extending downward from the base portion. The contact further includes a pair of contacting arms 103 with clamping portion 104 for clamping solder balls of a BGA devices (not shown). The contacts 100 are retained in an insulating housing of an electrical connector and the solder legs are soldered on a PCB. The connector is fitly set on the PCB. However conductive pads on the PCB will be destroyed after several replacement of different electrical connectors.

Therefore, an electrical connector with improved contacts is desired to overcome the disadvantages of the prior arts.

SUMMARY OF THE INVENTION

An object of the present invention is to provide improved contacts.

In order to achieve above-mentioned object, an electrical contact adapted for connection a ball grid array (BGA) device to a printed circuit board (PCB), comprises a pair of arm portions defining a pair of clamping portions at top ends thereof for corresponding solder balls of the BGA device, a C-shaped spring portion extending from a bottom end of one arm portion and a contacting portion extending from a free end of the spring portion for touch the PCB, the spring portion opens perpendicularly to the arm portions.

Other objects, advantages and novel features of the present invention will become more apparent from the following detailed description of the present embodiment when taken in conjunction with the accompanying drawings.

DETAILED DESCRIPTION OF THE INVENTION

Figure 1:
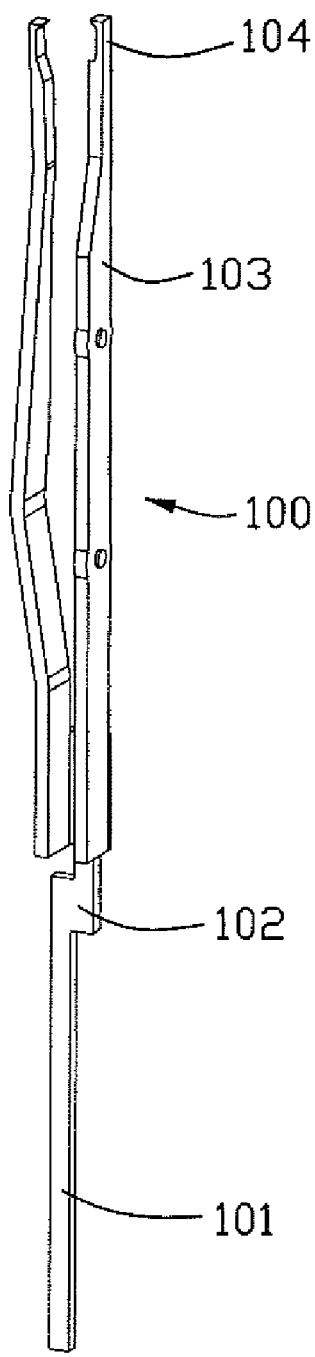
FIG. 1 is a perspective view of a conventional contact.

Reference will now be made to the drawing figures to describe a preferred embodiment of the present invention in detail.

Figure 2:
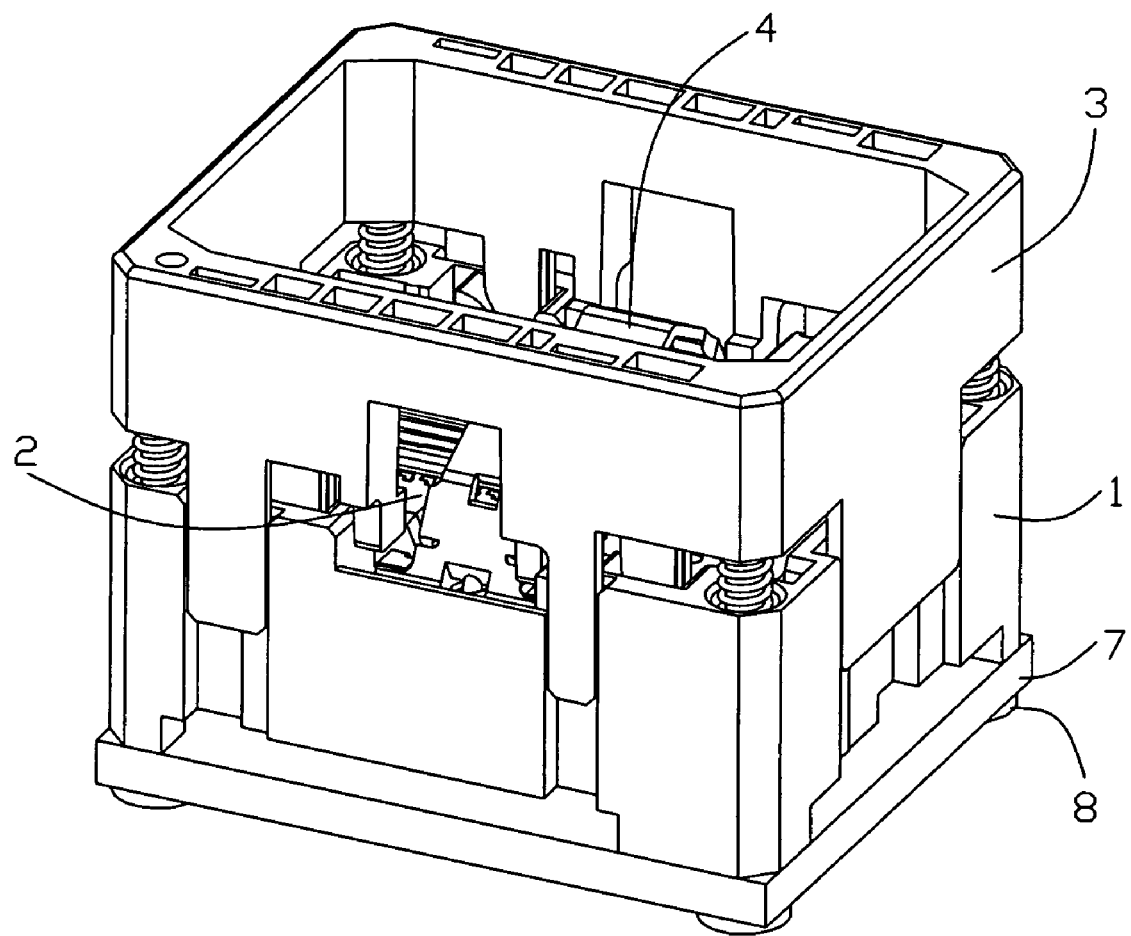
FIG. 2 is a perspective view of an electrical connector of a preferred embodiment of the present invention.
Figure 3:
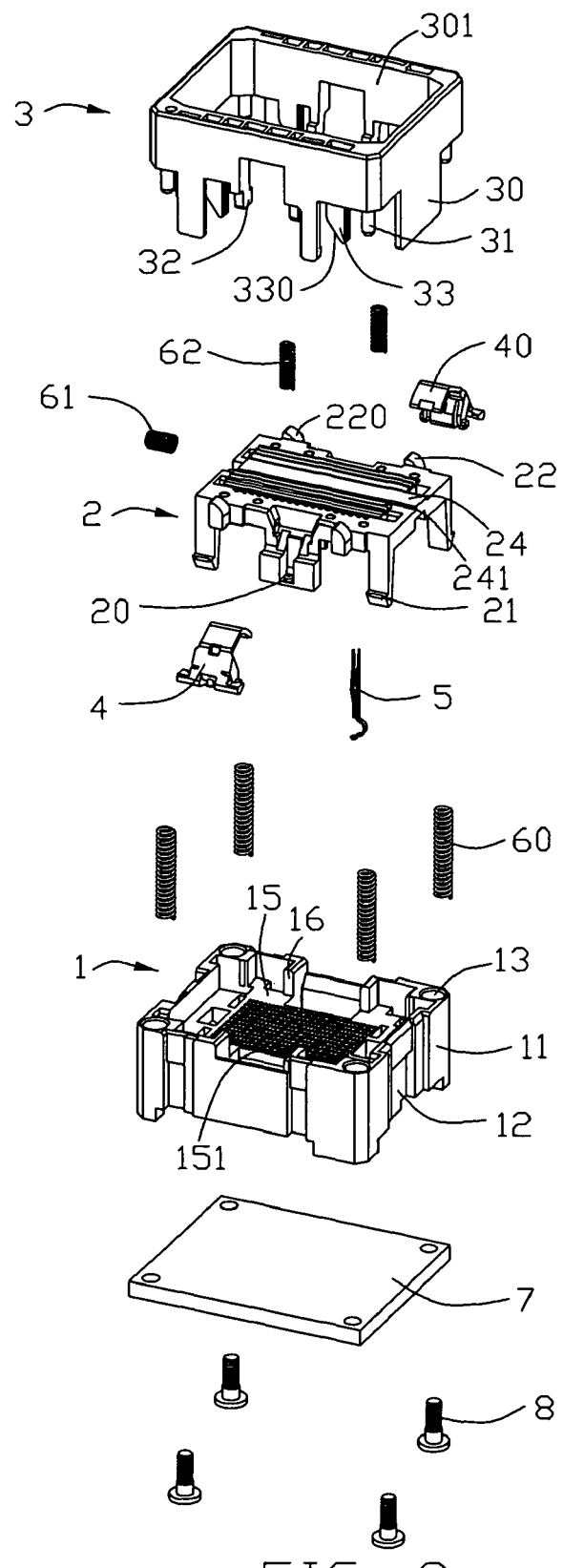
FIG. 3 is an exploded perspective view of the electrical connector shown in FIG. 2.

Referring to FIGS. 2 and 3, an electrical connector used to electrically and mechanically connect a BGA device mainly includes an insulating house 1, a movable member 2, an actuating member 3 and a pair of latching member 4.

Referring to FIGS. 3, the housing 1 has a bottom wall 15 and four side walls 11 perpendicular to the base wall to form a rectangular receiving cavity 16. The bottom wall defines a plurality of passageways 151, generally in an array of columns and rows, running though in the up and down direction. The outer faces of the side walls 11 define guiding grooves 12 along the up and down direction. Four receiving holes 13 are defined at four corners of the housing respectively to receive spring element such as first coil spring members 60.

Figure 4:
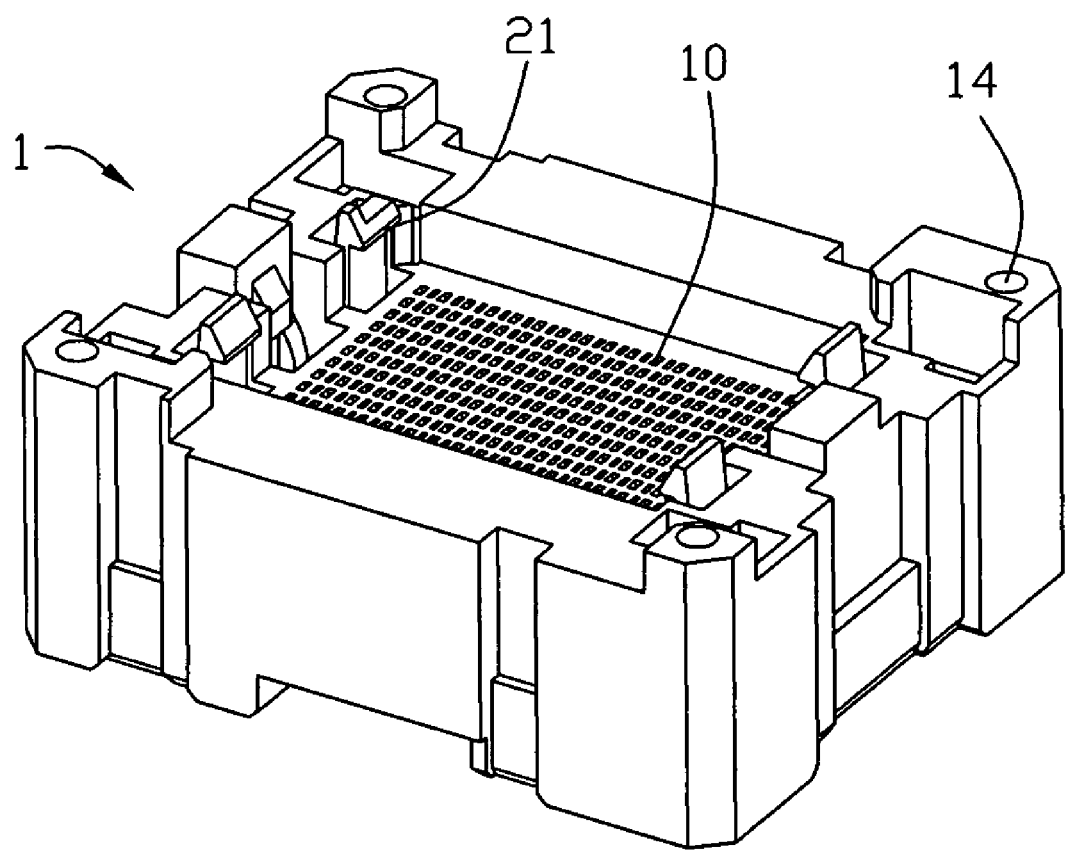
FIG. 4 is a perspective view of the insulating housing with the movable member shown in FIG. 3 from a bottom view.
Figure 5:
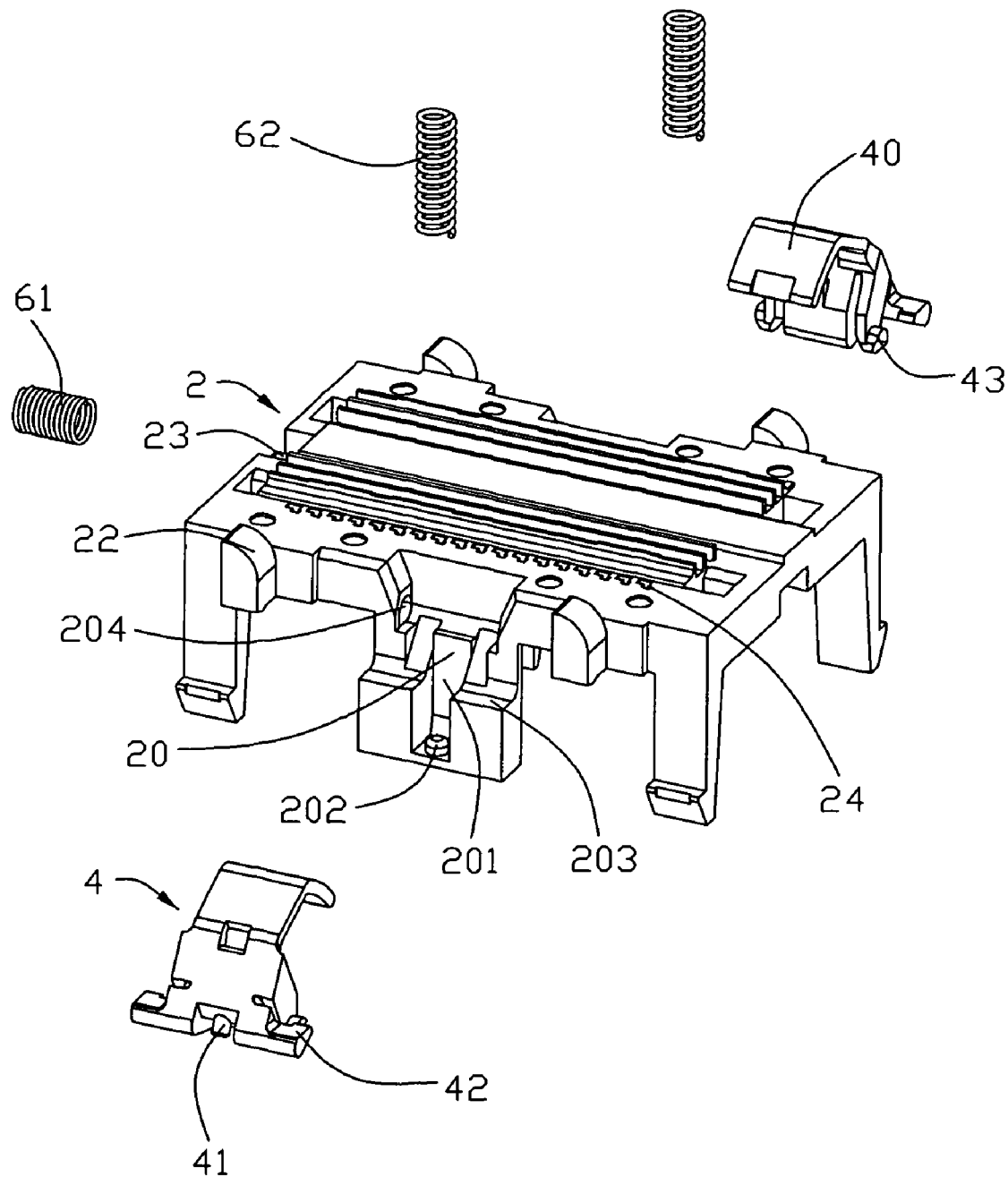
FIG. 5 is an enlarged perspective view of the movable member and the latching member shown in FIG. 3.

The movable member 2 is received in the cavity 16 of the housing 1. The movable member 2 includes a base portion 24 with a plurality of passageways 241 aligned with the passageways 151 of the housing. Four hook portions 21 extend downwards from four corner of the movable member 2, which is used to retain the movable member 2 in the cavity 16 as best shown in FIG. 4 where the hook portions 21 run through the bottom face of then housing. A pair of protrusions 22 each with an arc shaped guiding face 220, adjacent to the hook portions 21, are defined on two opposite sides of the base portion 24. A setting portion 20 extending downward from the middle portion of the sides of the base potion between the pair of the protruding portions 22. As best shown in FIG. 5, the setting portion 20 defines a recess portion 201 opening upward and forwards and a first post portion 202 protruding upward from the bottom of the recess portion 201. A pair of second receiving holes 204 are defined adjacent to the top opening of the recess portion 201 and an upwardly supporting surface 203 is defined at the middle portion of the setting portion 20. An outwardly second post portion 23 is defined at an end side of the base portion 24 and a second coil spring member 61 is assembled on the post portion 23.

The pair of latching member 4 is included to be assembled in the setting portion 20. As shown in FIG. 5, the latch member 4 defines a third post portion 41 extending downward from the middle portion of the bottom thereof. The post portions 41 and 202 joins together by a pair of third coil spring members 62. A pair of pressed portions 42 extends outward from opposite sides of the latching member 4 and a latching portion 40 extends upwards. The latching portion 40 has a downward distal free end, which is used to press against the movable member 2. A pair of shaft portion 43 extends outwards from the sides of the latching member in front of the pressed portion 42. The shaft portion 43 is received in the hole 204 so as to the latching member 4 is assembled in the setting portion 20. In a free position where the movable member has no exterior force exerted, the free ends of the latching portion 40 is abutting against the top face of the movable member 2.

The actuating member 30 comprises four side wall forming a rectangular cavity 301. Several guiding ribs 30 extend downward so as to slide in the corresponding guiding grooves 12. Four forth post portion 31 extends downwards and receive in the first coil spring 60 received in the receiving holes 13, which urge the actuating member 30 to shift upwards and downwards. A pair of pressing portions 32 extending downwards to press the supporting faces 203 of the latching member downwards. Actuating portions 33 adjacent to the pressing portions 32 have slanting faces 330 to press against the arc shaped guiding faces 220.

Figure 6:
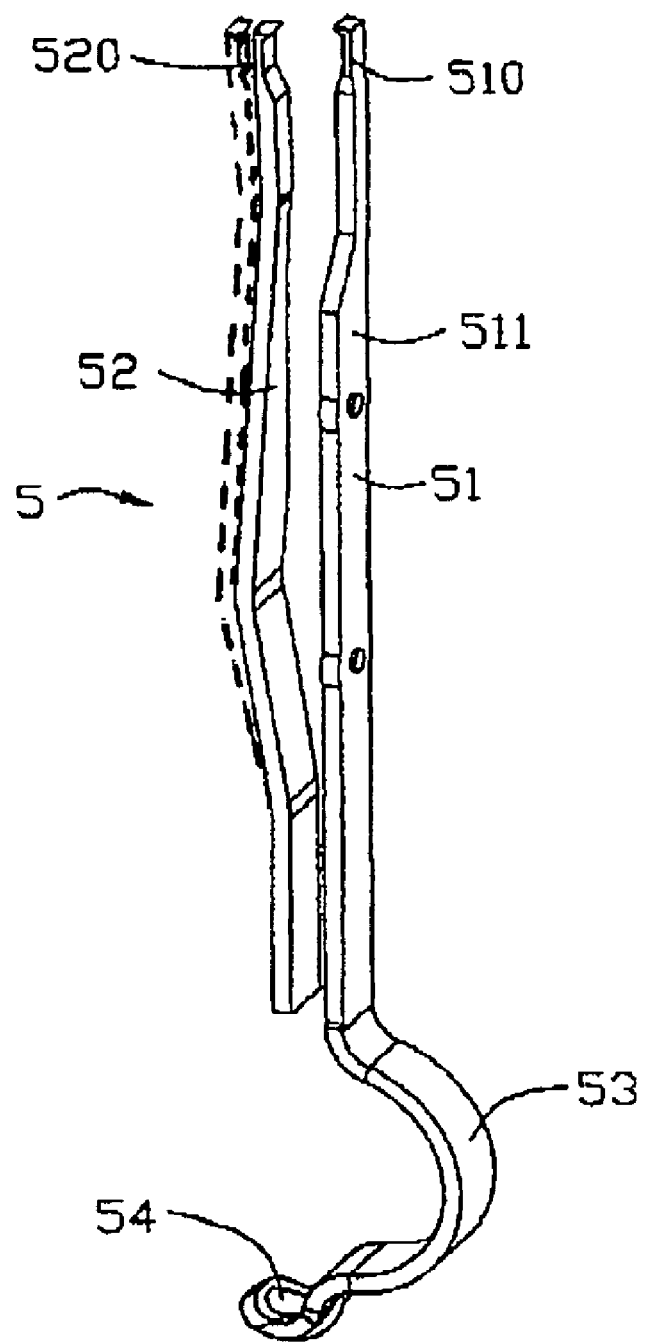
FIG. 6 is an enlarged perspective view of the contact shown in FIG. 3.

Referring to FIG. 6, the contacts are received in the passageways 151 and 241 of the housing 1 and the movable member 2. The contact 2 includes a pair of slim arm portions 51, 52 and the two arm portions join at bottom ends thereof. One arm portion 51 is used as a stationary arm while the other arm portion 52 is used as a movable arm (shown in the dashed line). The top end of the two arm portions are defined as clamping portions 510, 520. The top end 520 offset from the top end 510 in a direction perpendicular to the stationary arm 51. A C-shaped spring portion 53 extends downwards from the bottom of the stationary arm 51 and opens in a direction defined from said one arm portion 51 to the other arm portion 52. A C-shaped contacting portion 54, which is smaller than the spring portion 53, extends from the free end of the spring portion 53 and opens upwards.

The contacting portions 54 extend out of the bottom of the insulating housing 1. The connector is assembled on a PCB 7 through bolts 8 so that the contacting portions 53 elastically contact with corresponding conductive pads or traces of the PCB to complete electrical connection as FIG. 3 shown. The connector is removed from the PCB easily since the connector touches on the PCB, not soldered.

When an exterior force is exerted on the actuating member, the actuating member 3 is driven downwards until a final position where the post 31 is fully received in the hole 13. During the process, all the coil springs is compressed and the pressing portion 32 press the pressed portion 42 to urge the latching member 4 to rotate 90 degree so as the latching portions 40 departs from the movable member 2 and the BGA device can be put into the cavity 301. Meanwhile the actuating portions 33 press the protruding portion 22 to urge the movable member 2 to shift to another end of the cavity 16. As a result, movable arms 52 shift away from the stationary arm 51 so that the gap between the clamping portions 510, 520 are larger than the diameter of the solder balls. The solder balls are easy to enter into the clamping portions. The coil spring members will restore after the exterior force withdraws and the latching member 40 will return back to lock the BGA device. The BGA device can be taken out if an exterior force is exerted on the actuating member again.

However, the disclosure is illustrative only, changes may be made in detail, especially in matter of shape, size, and arrangement of parts within the principles of the invention.

What is claimed is:

1. An electrical contact adapted for connecting a ball grid array (BGA) device to a printed circuit board (PCB), comprising:
    a pair of arm portions defining a pair of clamping portions at top ends thereof for clamping solder balls of the BGA device;
    a spring portion of a C shape extending downwards from a bottom end of one arm portion, the C shaped opening in a direction defined from said one arm portion to the other arm portion;
    a contacting portion extending from a free end of the spring portion for touching the PCB.

2. The electrical contact as described in claim 1, wherein the contacting portion is substantially C-shaped and opens upwards.

3. The electrical contact as described in claim 2, wherein the C-shaped contacting portion is below and smaller than the C-shaped spring portion.

4. An electrical contact comprising:
    a lying U-shaped section defining opposite first and second side walls linked by a bight;
    a first arm extending upwardly from the first side wall in a stationary manner;
    a second arm extending upwardly from the second side wall in a moveable manner;
    upper ends of said first arm and said second arm commonly defining a solder ball receiving space;
    a leg downwardly extending from the first side wall, opposite to the first arm, with a contact end for engagement with an electric pad; wherein
    the leg is outwardly curved, the second arm is outwardly deflected while the first arm is straight.

5. The contact as claimed in claim 4, wherein the contact end opens upward and is aligned with the solder ball receiving space in a vertical direction.

6. The contact as claimed in claim 4, wherein the leg outwardly curved in a first transverse direction, and the second arm is outwardly deflected in a second transverse direction opposite to said first transverse direction.

7. An electrical contact comprising:
    a first arm portion and a second arm portions respectively extending upwardly from and linked by a bight portion, commonly defining a ball receiving space at top portions of the arm portions;
    the second arm portion arranged on a first side of the first arm portion;
    a leg extending downward from the first arm portion and having an arc portion protruding to a second side opposite to the first side of the first arm portion and a contact end for engagement with an electric pad.

8. The contact as claimed in claim 7, wherein the arc portion is of a C-shape opening toward the first side of the first arm portion.

9. The contact as claimed in claim 8, wherein the contact end is of a C-shape opening upwards.

10. The contact as claimed in claim 9, wherein the bight portion is at lateral sides of said two arm portions.

* * * * *